United States Patent
Chao et al.

(10) Patent No.: US 10,930,684 B2
(45) Date of Patent: Feb. 23, 2021

(54) PIXEL SENSING UNIT AND IMAGE CAPTURING DEVICE

(71) Applicant: Shenzhen Goodix Technology Co., Ltd., Guangdong (CN)

(72) Inventors: Wei-Min Chao, Taipei (TW); Chien-Jian Tseng, Taipei (TW)

(73) Assignee: Shenzhen Goodix Technology Co., Ltd., Guangdong (CN)

( * ) Notice: Subject to any disclaimer, the term of this patent is extended or adjusted under 35 U.S.C. 154(b) by 0 days.

(21) Appl. No.: 16/043,114

(22) Filed: Jul. 23, 2018

(65) Prior Publication Data

US 2018/0342546 A1   Nov. 29, 2018

Related U.S. Application Data

(63) Continuation of application No. PCT/CN2017/086098, filed on May 26, 2017.

(51) Int. Cl.
| | |
|---|---|
| *H01L 27/146* | (2006.01) |
| *H04N 5/347* | (2011.01) |
| *H04N 5/3745* | (2011.01) |
| *H04N 5/359* | (2011.01) |
| *H04N 5/372* | (2011.01) |

(52) U.S. Cl.
CPC .. *H01L 27/14603* (2013.01); *H01L 27/14643* (2013.01); *H04N 5/347* (2013.01); *H04N 5/359* (2013.01); *H04N 5/372* (2013.01); *H04N 5/3745* (2013.01)

(58) Field of Classification Search
CPC .............. H04N 5/341; H04N 5/347; H04N 5/335–347; H01L 27/146–14607
See application file for complete search history.

(56) References Cited

U.S. PATENT DOCUMENTS

| | | | |
|---|---|---|---|
| 6,756,576 B1 | 6/2004 | McElroy | |
| 2008/0012975 A1 | 1/2008 | Sato | |
| 2010/0214462 A1 | 8/2010 | Itakura | |
| 2014/0015025 A1 | 1/2014 | Ahn | |
| 2016/0344963 A1* | 11/2016 | Liim | H04N 5/3745 |
| 2017/0090047 A1* | 3/2017 | Shahar | G01T 1/17 |
| 2017/0092684 A1* | 3/2017 | Chang | H01L 27/1463 |
| 2017/0322319 A1* | 11/2017 | Iniewski | G01T 1/171 |
| 2019/0101657 A1* | 4/2019 | Shahar | H01L 27/14676 |
| 2020/0057167 A1* | 2/2020 | Shahar | G01T 1/241 |

FOREIGN PATENT DOCUMENTS

| | | | |
|---|---|---|---|
| CN | 101355659 A | | 1/2009 |
| CN | 102510450 A | | 6/2012 |
| CN | 103024308 A | * | 4/2013 |
| CN | 103024308 A | | 4/2013 |

* cited by examiner

*Primary Examiner* — Alia Sabur
(74) *Attorney, Agent, or Firm* — Winston Hsu (57) ABSTRACT

The present application provides a pixel sensing unit applied in an image capturing device, wherein the pixel sensing unit is corresponding to a light-sensing area and outputs a pixel value corresponding to the pixel sensing unit. The pixel sensing unit comprise a plurality of sub-pixel sensing units, configured to a plurality of sub-pixel values, wherein the plurality of sub-pixel sensing units corresponding to a plurality of sub-light-sensing areas, a summation of the plurality of sub-light-sensing areas corresponds to the light-sensing area; and an integrating unit, configured to output the pixel value corresponding to the pixel sensing unit according to the plurality of sub-pixel values.

19 Claims, 5 Drawing Sheets

PIXEL SENSING UNIT AND IMAGE CAPTURING DEVICE

CROSS-REFERENCE TO RELATED APPLICATIONS

The present application is a continuation of international application No. PCT/CN2017/086098, filed on May 26, 2017, of which are incorporated herein by reference in its entirety.

FIELD OF THE INVENTION

The present application relates to a pixel sensing unit and an image capturing device, and more particularly, to a pixel sensing unit and an image capturing device with high image capturing quality.

BACKGROUND

CMOS image sensor (CIS) has been widely applied in electronic devices with image capturing function and digital camera. In general, the image sensor comprises a pixel sensing array, the pixel sensing array comprises a plurality of pixel sensing units arranged in an array. The pixel sensing unit comprises a light-sensing component, such as a photo diode or a photo transistor, and a converting circuit. The sensitivity of the pixel sensing unit is related or proportional to a light-sensing area of the light-sensing component. Taking the pixel sensing unit comprising the photo diode as an example, the photo diode stores electronic charges induced by the light in the potential well of the photo diode, and the electronic charges are converted by the converting circuit comprising transistors into a voltage signal, where the voltage signal is the pixel value corresponding to the pixel sensing unit. Light sensitivity of the pixel sensing unit is related to an area of the photo diode in the circuit layout.

To achieve certain sensitivity of the image sensor, the pixel sensing unit is required to have a certain light-sensing area. In the prior art, each pixel sensing unit comprises a single light-sensing component. In other words, the single light-sensing component of the pixel sensing unit has to achieve the light-sensing area required by the pixel sensing unit. However, for the light-sensing component with large area, the electronic charges within the potential well is not easy to be completely drained out by the converting circuit. As such, the light-sensing component may have residual electronic charges, which may cause unnecessary image sticking effect on the digital camera. Therefore, it is necessary to improve the prior art.

SUMMARY

It is therefore a primary objective of the present application to provide a pixel sensing unit and an image capturing device with high image capturing quality, to improve over disadvantages of the prior art.

To solve the problem stated in the above, the present application provides a pixel sensing unit, applied in an image capturing device, wherein the pixel sensing unit is corresponding to a light-sensing area and outputs a pixel value corresponding to the pixel sensing unit. the pixel sensing unit comprise a plurality of sub-pixel sensing units, configured to output a plurality of sub-pixel values, wherein the plurality of sub-pixel sensing units are corresponding to a plurality of sub-light-sensing areas, and a summation of the plurality of sub-light-sensing areas corresponds to the light-sensing area; and an integrating unit, configured to output the pixel value corresponding to the pixel sensing unit according to the plurality of sub-pixel values.

Preferably, each sub-pixel sensing unit among the plurality of sub-pixel sensing units comprises a light-sensing component, and an area of the light-sensing component in a circuit layout is a sub-light-sensing area among the plurality of sub-light-sensing areas.

Preferably, each sub-pixel sensing unit among the plurality of sub-pixel sensing units comprises a converting circuit, the converting circuit comprises a plurality of transistors, and the converting circuit is configured to convert charges produced by light irradiation into a sub-pixel value of the each sub-pixel sensing unit.

Preferably, the integrating unit performs an average operation on the plurality of sub-pixel values, to output the pixel value as an average of the plurality of sub-pixel values.

Preferably, the integrating unit performs a summation operation on the plurality of sub-pixel values, to output the pixel value as a summation of the plurality of sub-pixel values.

Preferably, the integrating unit outputs the pixel value as a selected sub-pixel value among the plurality of sub-pixel values.

Preferably, the light-sensing area is evenly divided into the plurality of sub-light-sensing areas.

The present application provides an image capturing device. The image capturing device comprises a plurality of pixel sensing units, arranged in an array, configured to output a plurality of pixel values, wherein a pixel sensing unit among the plurality of pixel sensing units is corresponding to a light-sensing area and outputs a pixel value corresponding to the pixel sensing unit among the plurality of pixel values, the pixel sensing unit comprising a plurality of sub-pixel sensing units, configured to output a plurality of sub-pixel values, wherein the plurality of sub-pixel sensing units are corresponding to a plurality of sub-light-sensing areas, and a summation of the plurality of sub-light-sensing areas corresponds to the light-sensing area; and an integrating unit, configured to output the pixel value corresponding to the pixel sensing unit according to the plurality of sub-pixel values; and an analog-to-digital converting unit, coupled to the plurality of pixel sensing units.

The present application utilizes the light-sensing components occupying the smaller layout area within the pixel sensing unit to reduce the residual charges stored in the light-sensing component and eliminate unnecessary image sticking, which is able to achieve the same light sensitivity as the pixel sensing unit in the art. In addition, the present application may have advantages of enhance SNR and preventing the light-path crosstalk.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
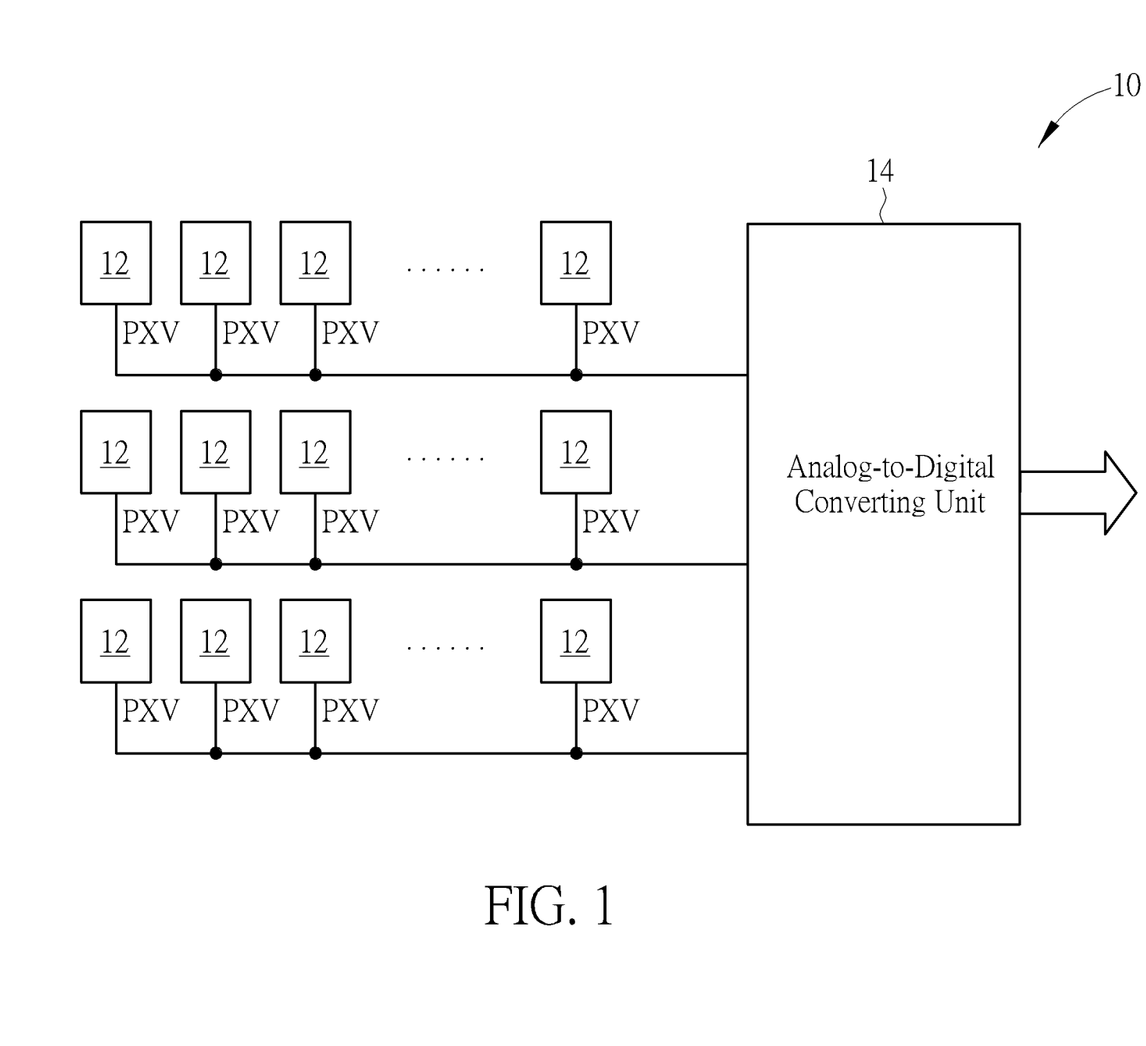
FIG. 1 is a schematic diagram of an image capturing device according to an embodiment of the present application.

FIG. 1 is a schematic diagram of an image capturing device 10 according to an embodiment of the present application. The image capturing device 10 may be an electronic device with an image capturing function, such as a phone or a tablet computer. The image capturing device 10 may also be a digital camera or a digital surveillance device. The image capturing device 10, configured to capture an image IMG, comprises a plurality of pixel sensing units 12 and an analog-to-digital converting unit 14. The plurality of pixel sensing units 12 are arranged as an array, and configured to output a plurality of pixel values PXV of the image IMG, where one pixel sensing unit 12 outputs one pixel value PXV. In addition, the pixel sensing unit 12 may, but not limited to, be a CMOS image sensor (CIS) or a charge-coupled device (CCD). As long as the pixel sensing units 12 are exposed to light and output the corresponding pixel values PXV, the requirements of the present application are satisfied. The analog-to-digital converting unit 14, coupled to the plurality of pixel sensing units 12, is configured to convert the analog pixel values PXV into digital signals, such that a backend signal processing module (not shown in FIG. 1) may perform image processing operation. In addition, to maintain certain light sensitivity for the image capturing device 10, (the light-sensing component of) each pixel sensing unit 12 is required to occupy a light-sensing area Ar.

Figure 2:
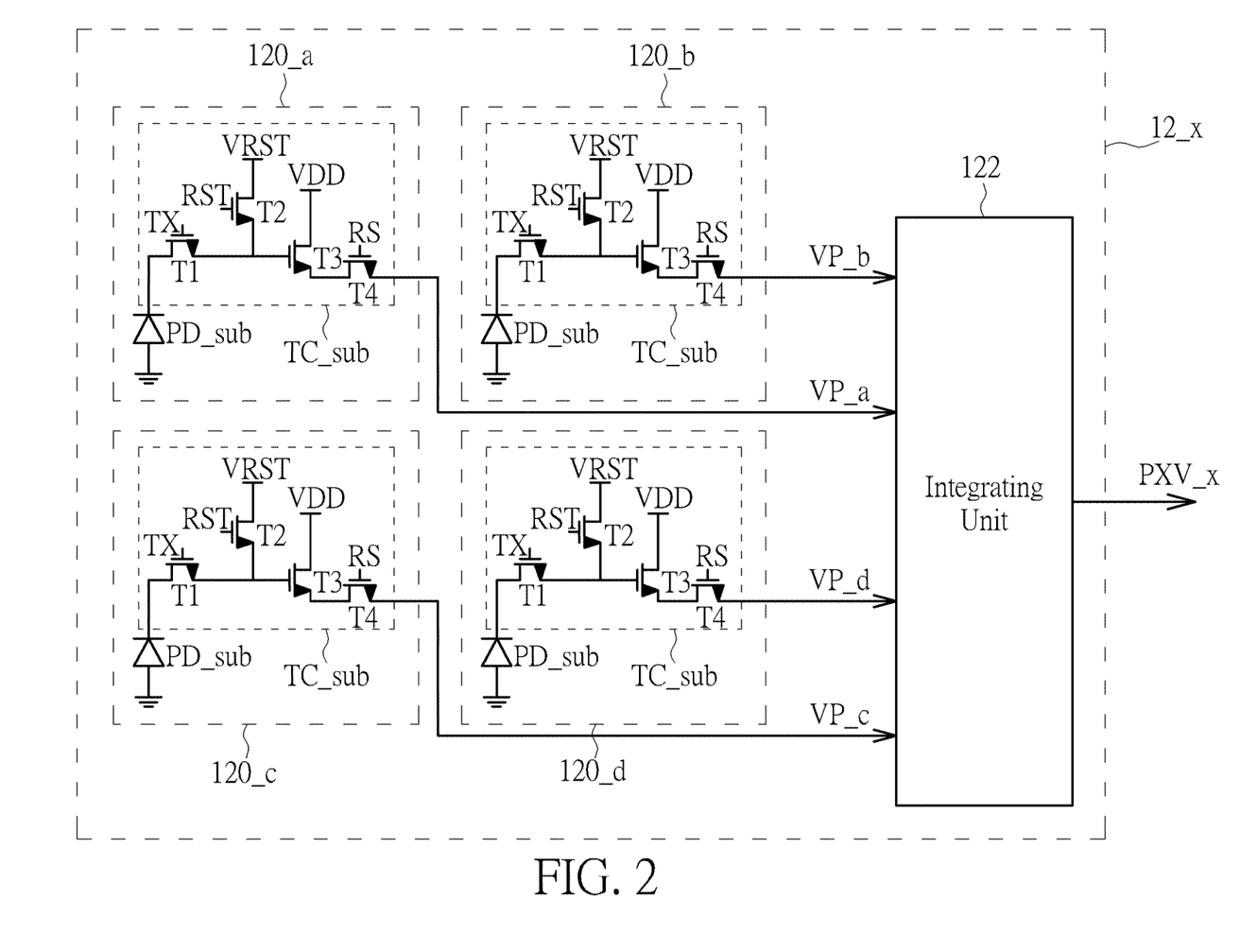
FIG. 2 is a schematic diagram of a pixel sensing unit according to an embodiment of the present application.
Figure 3:
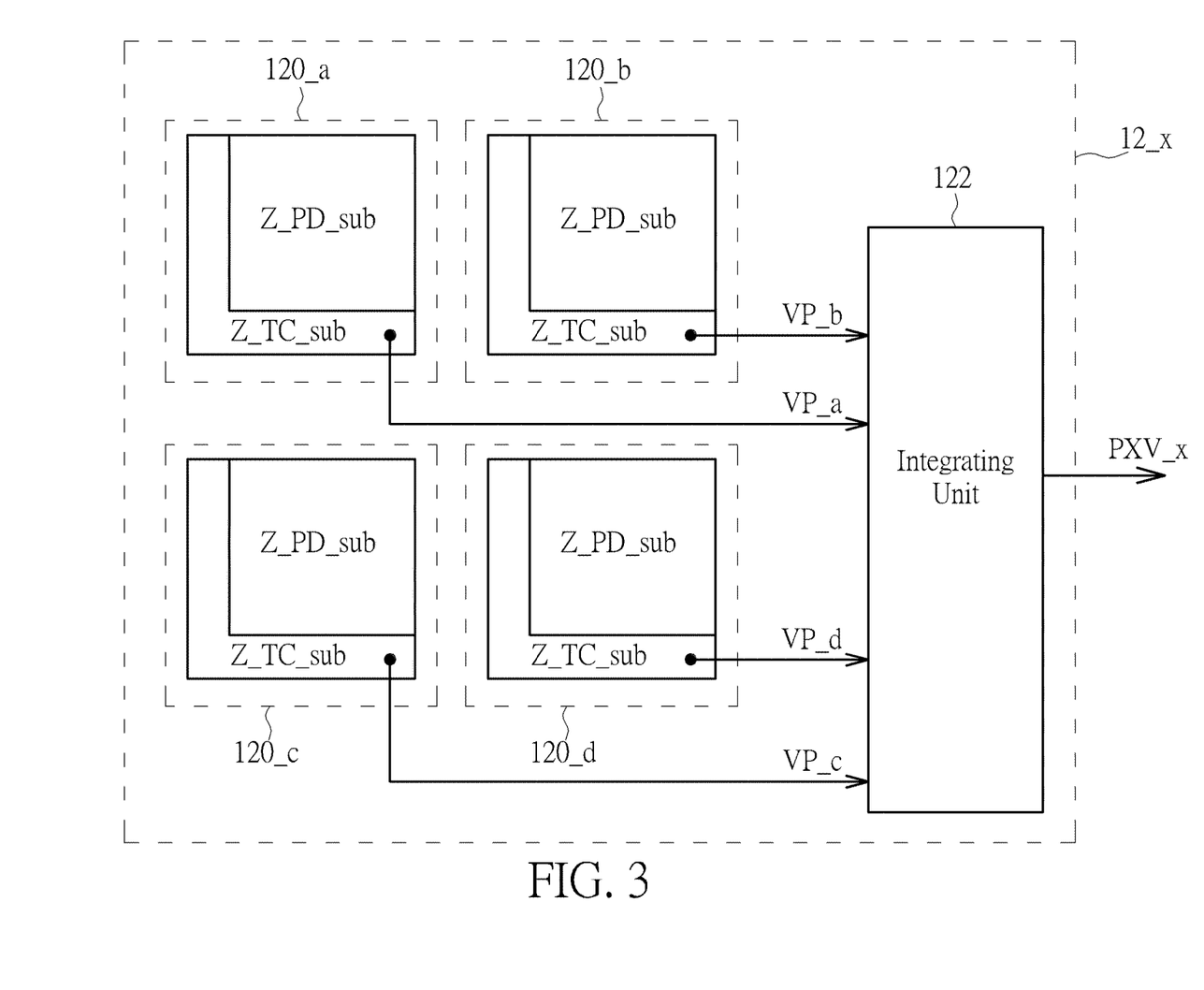
FIG. 3 is a schematic diagram of a circuit layout of the pixel sensing unit in FIG. 2.

Furthermore, please refer to FIG. 2, which is a schematic diagram of a pixel sensing unit 12_x of the plurality of pixel sensing units 12 according to an embodiment of the present application. The pixel sensing unit 12_x may be configured to realize any one of the plurality of pixel sensing units 12, and the light-sensing component of the pixel sensing unit 12_x is required to occupy the light-sensing area Ar, which will be detailed afterward. As shown in FIG. 2 and FIG. 3, the pixel sensing unit 12_x comprises a plurality of sub-pixel sensing units 120_a, 120_b, 120_c, 120_d and an integrating unit 122. The sub-pixel sensing units 120_a, 120_b, 120_c and 120_d output sub-pixel values VP_a, VP_b, VP_c and VP_d, respectively. The integrating unit 122, coupled to the sub-pixel sensing units 120_a, 120_b, 120_c and 120_d, is configured to integrate the sub-pixel values VP_a, VP_b, VP_c, VP_d as a pixel value PXV_x corresponding to the pixel sensing unit 12_x.

Taking the sub-pixel sensing unit 120_a as an example, the sub-pixel sensing unit 120 a comprises a light-sensing component PD_sub and a converting circuit TC_sub. The light-sensing component PD_sub may be a photo diode. The light-sensing component PD_sub is exposed to light to produce electronic charges, and stores the electronic charges caused by the light in a potential well of the light-sensing component PD_sub. The converting circuit TC_sub, coupled to the light-sensing component PD_sub, comprises transistors T1-T4. The converting circuit TC_sub is configured to drain out the electronic charges stored in the light-sensing component PD_sub, which are caused by being exposed to the light, and convert the electronic charges into the sub-pixel value VP_a. The circuit structure and the operation principle of each of the sub-pixel sensing units 120_b, 120_c and 120_d are the same as that of the sub-pixel sensing unit 120_a, which is not narrated for brevity.

Please refer to FIG. 3, which is a schematic diagram of circuit layout of the sub-pixel sensing units 120_a, 120_b, 120_c and 120_d within the pixel sensing unit 12_x according to an embodiment of the present application. In FIG. 3, a light-sensing component zone Z_PD_sub and a converting circuit zone Z_TC_sub are shown. The light-sensing component zone Z_PD_sub represents a circuit layout region occupied by the light-sensing component PD_sub, and the converting circuit zone Z_TC_sub represents a circuit layout region occupied by the converting circuit TC_sub. Notably, light-sensing component zones Z_PD_sub (i.e., the light-sensing component PD_subs) within the sub-pixel sensing units 120_a, 120_b, 120_c and 120_d occupy sub-light-sensing areas Ar_sub_a, Ar_sub_b, Ar_sub_c and Ar_sub_d in circuit layout, respectively, where a summation of the sub-light-sensing areas Ar_sub_a, Ar_sub_b, Ar_sub_c and Ar_sub_d is substantially equal to the light-sensing area Ar of the pixel sensing unit 12_x (or the pixel sensing unit 12). For example, if the pixel sensing unit 12 is required to occupy 50×50 $\mu m^2$ as the light-sensing area Ar, the sub-light-sensing areas Ar_sub_a, Ar_sub_b, Ar_sub_c and Ar_sub_d of the sub-pixel sensing units 120_a, 120_b, 120_c and 120_d may be 25×25 $\mu m^2$, i.e., a sub-light-sensing area may be Ar/4. In other words, the light-sensing area Ar is equally divided into the sub-light-sensing areas Ar_sub_a, Ar_sub_b, Ar_sub_c and Ar_sub_d. In addition, the integrating unit 122 may perform a summation operation on the sub-pixel values VP_a, VP_b, VP_c and VP_d, to output the pixel value PXV_x as a summation of the sub-pixel values VP_a, VP_b, VP_c and VP_d, i.e., the integrating unit 122 may output the pixel value PXV_x as PXV_x=VP_a+VP_b+VP_c+VP_d. Thus, the pixel sensing unit 12_x may achieve the light sensitive corresponding to the light-sensing area Ar, and also solves the problem in the art, in which the charges stored in the light-sensing component are not easy to be completely drained out.

Figure 4:
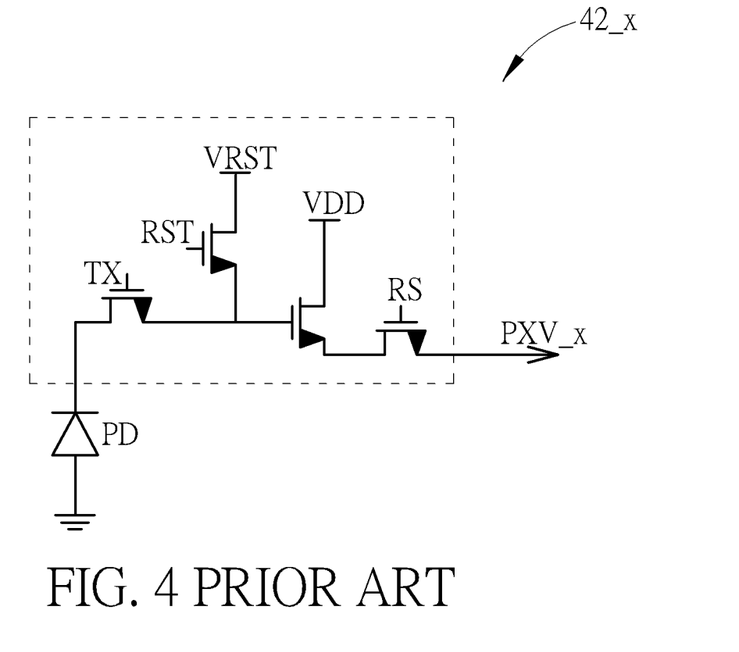
FIG. 4 is a schematic diagram of a typical pixel sensing unit.
Figure 5:
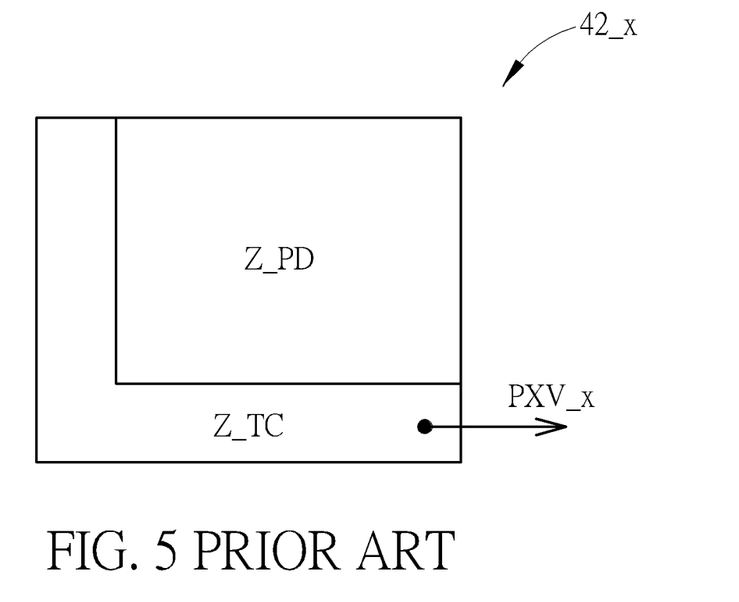
FIG. 5 is a schematic diagram of circuit layout of the pixel sensing unit in FIG. 4.

In comparison, please refer to FIG. 4 and FIG. 5. FIG. 4 and FIG. 5 are a schematic circuit diagram and a layout diagram of a typical pixel sensing unit 42_x. The pixel sensing unit 42_x is configured to output the pixel value PXV_x corresponding to the pixel sensing unit 42_x. The pixel sensing unit 42_x comprises a light-sensing component PD and a converting circuit TC. The circuit structure and operation principle of the pixel sensing unit 42_x are similar to that of the sub-pixel sensing unit 120_a, and not narrated herein for brevity. Different from the sub-pixel sensing unit 120_a, to achieve the same light sensitivity, the light-sensing component PD of the pixel sensing unit 42_x occupies the entire light-sensing area Ar in the circuit layout, i.e., the light-sensing component zone Z_PD occupies the entire light-sensing area Ar in the circuit layout. Therefore, since the light-sensing component PD occupies a larger area (compared to the area occupied by the light-sensing component PD_sub of the sub-pixel sensing unit 120_a), the electronic charges stored in the light-sensing component PD occupying a large area are not easy to be completely drained out by the converting circuit TC. Compared to the pixel sensing unit 12_x, the light-sensing component PD of the pixel sensing unit 42_x may have residual electronic charges, which may cause unnecessary image sticking effect on the digital camera or the electronic device in which the pixel sensing unit 42_x is included.

In short, the pixel sensing unit 12_x utilizes the light-sensing component PD_sub occupying a smaller circuit layout area to reduce the residual charges stored within the light-sensing component PD_sub, so as to eliminate the unnecessary image sticking effect. The pixel sensing unit 12_x also utilizes the sub-pixel sensing units 120_a, 120_b, 120_c and 120_d with the plurality of light-sensing components PD_sub occupying smaller areas (which are smaller than the light-sensing area Ar). As such, the summation of the sub-light-sensing areas Ar_sub_a, Ar_sub_b, Ar_sub_c and Ar_sub_d is the light-sensing area Ar, so as to achieve the same light sensitivity as which of the pixel sensing unit 42. Thus, the quality of the image capturing device 10 capturing the image IMG is enhanced.

Notably, the embodiments stated in the above are utilized for illustrating the concept of the present application. Those skilled in the art may make modifications and alterations accordingly, and not limited herein. For example, in order to enhance a signal-to-noise ratio (SNR) corresponding to the pixel value PXV_x, the integrating unit 122 performs an average operation on the sub-pixel values VP_a, VP_b, VP_c and VP_d, to output the pixel value PXV_x as an average of the sub-pixel values VP_a, VP_b, VP_c and VP_d, i.e., to output the pixel value PXV_x as PXV_x= (VP_a+VP_b+VP_c+VP_d)/4. Since noise within the sub-pixel values VP_a, VP_b, VP_c and VP_d are uncorrelated. When the pixel value PXV_x is the average of the sub-pixel values VP_a, VP_b, VP_c and VP_d, the noise within the sub-pixel values VP_a, VP_b, VP_c and VP_d may be cancelled or compensated by each other, so as to enhance the SNR corresponding to the pixel value PXV_x. Preferably, under a condition of the integrating unit 122 performing the average operation on the sub-pixel values VP_a, VP_b, VP_c and VP_d, the light-sensing area Ar may be equally divided into the sub-light-sensing areas Ar_sub_a, Ar_sub_b, Ar_sub_c and Ar_sub_d.

Figure 6:
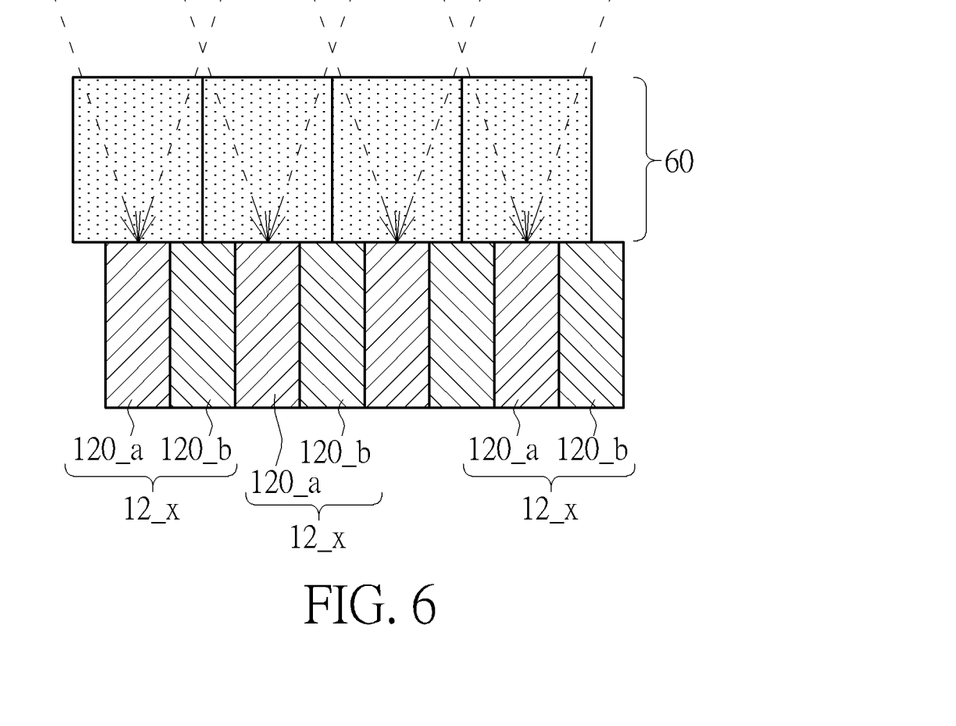
FIG. 6 is a schematic diagram of a plurality of pixel sensing units according to an embodiment of the present application.
Figure 7:
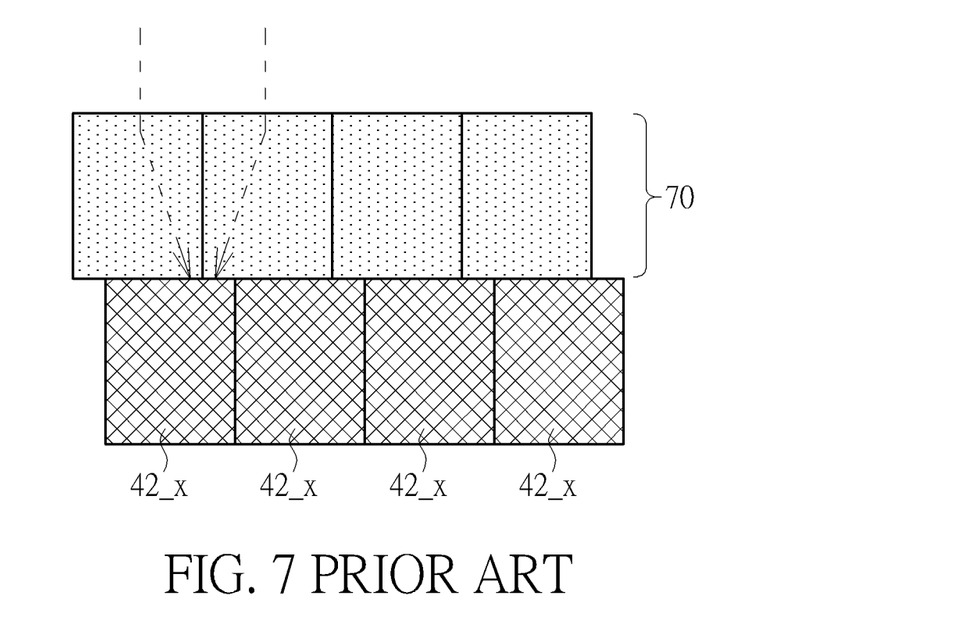
FIG. 7 is a schematic diagram of a plurality of pixel sensing units.

In addition, to prevent crosstalk between light-paths, the integrating unit 122 may output the pixel value PXV_x as a selected one of the sub-pixel values VP_a, VP_b, VP_c and VP_d. In detail, please refer to FIG. 6 and FIG. 7. FIG. 6 is a schematic diagram of the plurality of pixel sensing units 12_x according to an embodiment of the present application. FIG. 7 is a schematic diagram of a plurality of pixel sensing units 42_x. In general, a collimator 60 and a collimator 70 are usually disposed above the plurality of pixel sensing units 12_x and the plurality of pixel sensing units 42_x, respectively for project the light onto the pixel sensing unit 12_x and the pixel sensing unit 42_x. For illustrative purpose, only one dimension of the two-dimensional pixel sensing units array is illustrated in FIG. 6, i.e., only the sub-pixel sensing units 120_a and 120_b of the pixel sensing unit 12_x are illustrated in FIG. 6. Notably, the pixel sensing unit 42_x and the collimator 70 are not perfectly aligned, such that the light-path crosstalk happens between the different pixel sensing units 42_x. In comparison, even the pixel sensing unit 12_x and the collimator 60 are not perfectly aligned, the integrating unit 122 may output the pixel value PXV_x as the sub-pixel value VP_a, so as to reduce the light-path crosstalk between the different pixel sensing units 12_x, which is to solve the light-path crosstalk problem caused by non-perfect alignment between the pixel sensing units 42_x and the collimator 70. Preferably, under a condition of the integrating unit 122 outputting the pixel value PXV_x as one sub-pixel value among the sub-pixel values VP_a, VP_b, VP_c and VP_d, the light-sensing area Ar may be equally divided into the sub-light-sensing areas Ar_sub_a, Ar_sub_b, Ar_sub_c and Ar_sub_d.

In addition, the light-sensing component PD_sub is not limited to be a photo diode. The light-sensing component PD_sub may also be a photo transistor. As long as the summation of the plurality of sub-light-sensing areas in the circuit layout corresponding to the light-sensing components PD_sub is equal to the light-sensing area Ar corresponding to the specified light sensitivity, the requirements of the present application are satisfied, which is within the scope of the present application. In addition, the pixel sensing unit is not limited to comprising four sub-pixel sensing units. The pixel sensing unit may comprise a plurality of sub-pixel sensing units. The light-sensing area Ar is not limited to be equally divided into the plurality of sub-light-sensing areas of the plurality of sub-pixel sensing units. As long as the summation of the plurality of sub-light-sensing areas is equal to the light-sensing area Ar, the requirements of the present application are satisfied, which is within the scope of the present application.

In summary, the present application utilizes the light-sensing components occupying the smaller layout area within the pixel sensing unit to reduce the residual charges stored in the light-sensing component and eliminate unnecessary image sticking. The present application also utilizes the plurality of sub-pixel sensing units, such that the summation of the sub-light-sensing areas is the light-sensing area corresponding to the specified light sensitivity, to achieve the same light sensitivity as the pixel sensing unit (comprising the light-sensing component with large area) in the art, so as to enhance image capturing quality of the image capturing device. In addition, the present application may have advantages of enhance SNR and preventing the light-path crosstalk.

The foregoing is only embodiments of the present application, which is not intended to limit the present application. Any modification following the spirit and principle of the present application, equivalent substitutions, improvements should be included within the scope of the present application.

What is claimed is:

1. A pixel sensing unit, applied in an image capturing device, characterized in that, the pixel sensing unit has a light-sensing area and outputs a pixel value corresponding to the light-sensing area, the pixel sensing unit comprises:
   a plurality of sub-pixel sensing units, configured to output a plurality of sub-pixel values, wherein the plurality of sub-pixel sensing units are corresponding to a plurality of sub-light-sensing areas, and a summation of the plurality of sub-light-sensing areas is equal to the light-sensing area; and
   an integrating unit, coupled to the plurality of sub-pixel sensing units to receive the plurality of sub-pixel values, configured to output the pixel value corresponding to the light-sensing area according to the plurality of sub-pixel values;
   wherein the light-sensing area is evenly divided into the plurality of sub-light-sensing areas;
   wherein a collimator is disposed above the pixel sensing unit, and a light-projecting hole of the collimator is corresponding to the pixel sensing unit;
   wherein the light-projecting hole is not perfectly aligned with the pixel sensing unit, and at least one of the plurality of sub-pixel sensing units is not disposed totally within a boundary of the light-projecting hole.

2. The pixel sensing unit of claim 1, characterized in that, each sub-pixel sensing unit among the plurality of sub-pixel sensing units comprises a light-sensing component, and an area of the light-sensing component in a circuit layout is a sub-light-sensing area among the plurality of sub-light-sensing areas.

3. The pixel sensing unit of claim 2, characterized in that, each sub-pixel sensing unit among the plurality of sub-pixel sensing units comprises a converting circuit, the converting circuit comprises a plurality of transistors, and the converting circuit is configured to convert charges caused by light exposure into a sub-pixel value of the each sub-pixel sensing unit.

4. The pixel sensing unit of claim 1, characterized in that, the integrating unit performs an average operation on the plurality of sub-pixel values, to output the pixel value as an average of the plurality of sub-pixel values.

5. The pixel sensing unit of claim 1, characterized in that, the integrating unit performs a summation operation on the plurality of sub-pixel values, to output the pixel value as a summation of the plurality of sub-pixel values.

6. The pixel sensing unit of claim 1, characterized in that, the integrating unit outputs the pixel value as a selected sub-pixel value among the plurality of sub-pixel values.

7. The pixel sensing unit of claim 1, wherein the integrating unit is configured to perform an average operation on the plurality of sub-pixel values, wherein noise within the sub-pixel values are canceled by each other in the average operation of the integrating unit, and an average of the plurality of sub-pixel values with noise cancellation is output as the pixel value.

8. An image capturing device, comprising:
a plurality of pixel sensing units, arranged in an array, configured to output a plurality of pixel values, wherein a pixel sensing unit among the plurality of pixel sensing units—has a light-sensing area and outputs a pixel value corresponding to the light-sensing area, the pixel sensing unit comprising:
  a plurality of sub-pixel sensing units, configured to output a plurality of sub-pixel values, wherein the plurality of sub-pixel sensing units are corresponding to a plurality of sub-light-sensing areas, and a summation of the plurality of sub-light-sensing areas is equal to the light-sensing area; and
  an integrating unit, coupled to the plurality of sub-pixel sensing units to receive the plurality of sub-pixel values, configured to output the pixel value corresponding to the light-sensing area according to the plurality of sub-pixel values; and
an analog-to-digital converting unit, coupled to the plurality of pixel sensing units;
wherein the light-sensing area is evenly divided into the plurality of sub-light-sensing areas;
wherein a collimator is disposed above the pixel sensing unit, and a light-projecting hole of the collimator is corresponding to the pixel sensing unit;
wherein the light-projecting hole is not perfectly aligned with the pixel sensing unit, and at least one of the plurality of sub-pixel sensing units is not disposed totally within a boundary of the light-projecting hole.

9. The image capturing device of claim 8, characterized in that, each sub-pixel sensing unit among the plurality of sub-pixel sensing units comprises a light-sensing component, and an area of the light-sensing component in a circuit layout is a sub-light-sensing area among the plurality of sub-light-sensing areas.

10. The image capturing device of claim 9, characterized in that, each sub-pixel sensing unit among the plurality of sub-pixel sensing units comprises a converting circuit, the converting circuit comprises a plurality of transistors, and the converting circuit is configured to convert charges caused by light exposure into a sub-pixel value of the each sub-pixel sensing unit.

11. The image capturing device of claim 8, characterized in that, the integrating unit performs an average operation on the plurality of sub-pixel values, to output the pixel value as an average of the plurality of sub-pixel values.

12. The image capturing device of claim 8, characterized in that, the integrating unit performs a summation operation on the plurality of sub-pixel values, to output the pixel value as a summation of the plurality of sub-pixel values.

13. The image capturing device of claim 8, characterized in that, the integrating unit outputs the pixel value as a selected sub-pixel value among the plurality of sub-pixel values.

14. An apparatus, comprising:
a plurality of pixel sensing units arranged in an array, wherein each pixel sensing unit has a light-sensing area and outputs a pixel value corresponding to the light-sensing area, and the each pixel sensing unit comprises:
  a plurality of sub-pixel sensing units, configured to output a plurality of sub-pixel values respectively; and
  an integrating unit coupled to the plurality of sub-pixel sensing units, and configured to generate the pixel value corresponding to the light-sensing area based on the plurality of sub-pixel values; and
an analog-to-digital converting unit, coupled to the plurality of pixel sensing units;
wherein each of the sub-pixel sensing units has a sub-light-sensing area, and sub-light-sensing areas of the sub-pixel sensing units cooperatively form a light-sensing area of the pixel sensing unit, and the light-sensing area of the pixel sensing unit is evenly divided into the plurality of sub-light-sensing areas;
wherein a collimator is disposed above the pixel sensing unit, and a light-projecting hole of the collimator is corresponding to the pixel sensing unit;
wherein the light-projecting hole is not perfectly aligned with the pixel sensing unit, and at least one of the plurality of sub-pixel sensing units is not disposed totally within a boundary of the light-projecting hole.

15. The apparatus of claim 14, wherein the integrating unit is configured to perform an average operation on the plurality of sub-pixel values, wherein noise within the sub-pixel values are canceled by each other in the average operation of the integrating unit, and an average of the plurality of sub-pixel values with noise cancellation is output as the pixel value.

16. The apparatus of claim 15, wherein the integrating unit performs an average operation on the plurality of sub-pixel values, to output the pixel value as an average of the plurality of sub-pixel values.

17. The apparatus of claim 15, wherein the integrating unit performs a summation operation on the plurality of sub-pixel values, to output the pixel value as a summation of the plurality of sub-pixel values.

18. The apparatus of claim 15, wherein the integrating unit outputs the pixel value as a selected sub-pixel value among the plurality of sub-pixel values.

19. The image capturing device of claim 8, wherein the integrating unit is configured to perform an average operation on the plurality of sub-pixel values, wherein noise within the sub-pixel values are canceled by each other in the average operation of the integrating unit, and an average of the plurality of sub-pixel values with noise cancellation is output as the pixel value.

* * * * *